(12) United States Patent
Kajigaya et al.

(10) Patent No.: US 7,995,373 B2
(45) Date of Patent: Aug. 9, 2011

(54) SEMICONDUCTOR MEMORY DEVICE AND INFORMATION PROCESSING SYSTEM

(75) Inventors: Kazuhiko Kajigaya, Tokyo (JP); Eiichiro Kakehashi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 64 days.

(21) Appl. No.: 12/549,124

(22) Filed: Aug. 27, 2009

(65) Prior Publication Data

US 2010/0054018 A1 Mar. 4, 2010

(30) Foreign Application Priority Data

Aug. 29, 2008 (JP) ................................ 2008-222943

(51) Int. Cl.
 *G11C 11/24* (2006.01)
(52) U.S. Cl. ..................... 365/148; 365/149; 365/185.08
(58) Field of Classification Search ............... 365/189.2, 365/174
See application file for complete search history.

(56) References Cited

U.S. PATENT DOCUMENTS

| | | | | |
|---|---|---|---|---|
| 5,661,319 A * | 8/1997 | Fujii et al. | ...................... | 257/295 |
| 5,675,547 A * | 10/1997 | Koga | ........................ | 365/230.03 |
| 5,910,911 A * | 6/1999 | Sekiguchi et al. | ............ | 365/145 |
| 5,969,981 A * | 10/1999 | Kono | ............................. | 365/145 |
| 6,665,207 B2 * | 12/2003 | Wald et al. | .................... | 365/149 |
| 6,735,108 B2 * | 5/2004 | Kurth et al. | ................... | 365/149 |

FOREIGN PATENT DOCUMENTS

| | | |
|---|---|---|
| JP | 7-94681 A | 4/1995 |
| JP | 9-82914 A | 3/1997 |

* cited by examiner

*Primary Examiner* — Tan T. Nguyen
(74) *Attorney, Agent, or Firm* — Sughrue Mion, PLLC

(57) ABSTRACT

A semiconductor memory device comprises a memory cell array and a forming controller. The memory cell array includes a plurality of first memory cells each having a structure in which dielectric material is sandwiched between two electrodes, and the memory cell array is divided into a plurality of areas capable of being designated. The forming controller controls to perform "forming" for the first memory cells in an area selectively designated from the plurality of areas of the memory cell array, and as a result of the forming, the first memory cells are changed to non-volatile second memory cells.

10 Claims, 12 Drawing Sheets

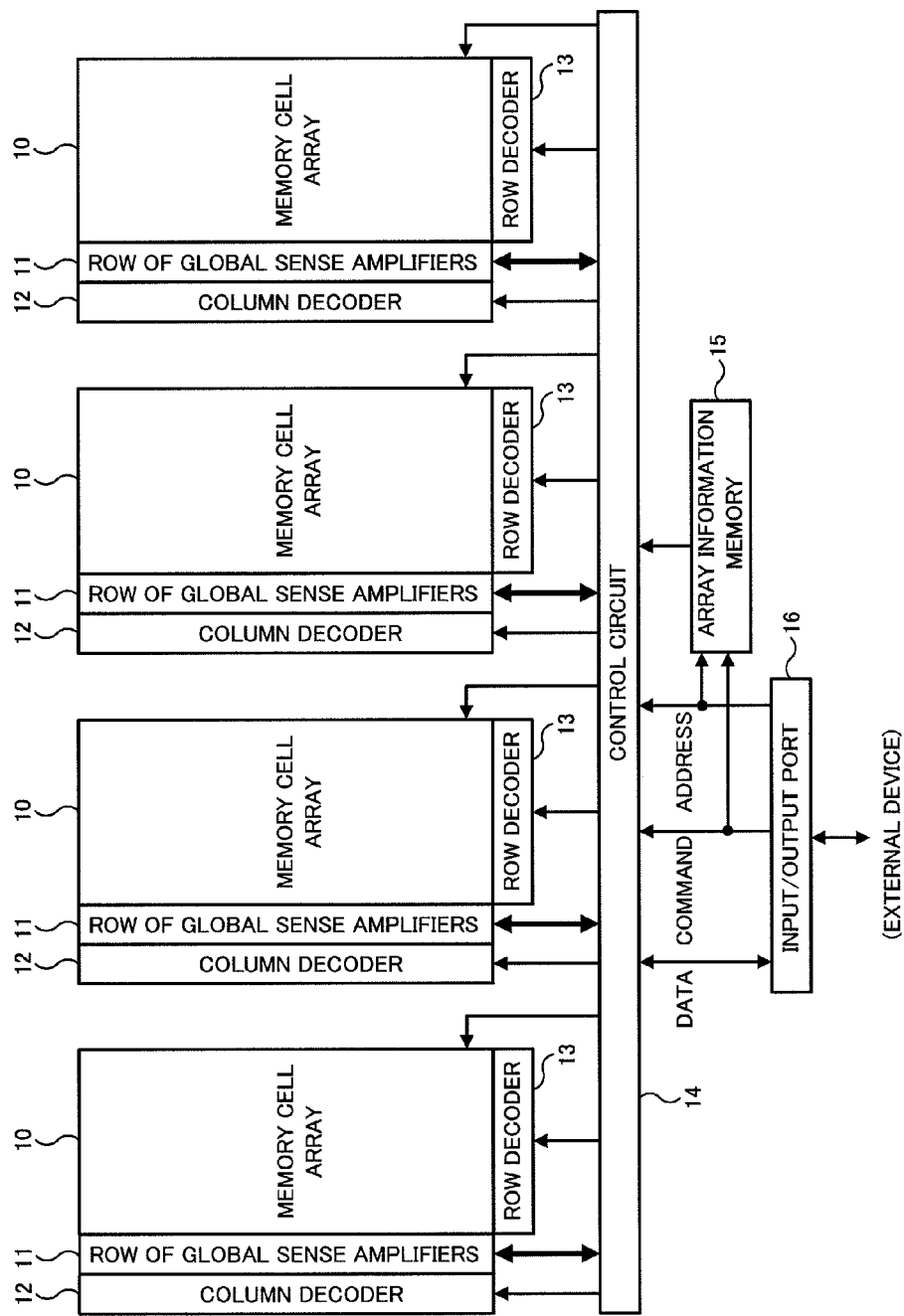

DRAM MEMORY CELL ARRAY (BEFORE FORMING)

RRAM MEMORY CELL ARRAY (AFTER FORMING)

SYSTEM CONFIGURATION EXAMPLE OF MOBILE PHONE

SEMICONDUCTOR MEMORY DEVICE AND INFORMATION PROCESSING SYSTEM

BACKGROUND OF THE INVENTION

1. Field of the Invention

The present invention relates to a semiconductor memory device using memory cells each storing information in a capacitor having dielectric material sandwiched by two electrodes, and particularly relates to a semiconductor memory device configured to perform "forming" for the capacitor of each memory cell in an arbitrary area of a memory cell array including a plurality of the memory cells each having the capacitor.

2. Description of Related Art

A DRAM (Dynamic Random Access Memories) which is a typical semiconductor memory device has been conventionally widely used. A memory cell of the DRAM is composed of a capacitor formed of dielectric material. Meanwhile, research and development of various non-volatile RAMs as semiconductor memory devices have been advanced. One of the non-volatile RAMs is a RRAM (Resistance Random Access Memory) using a variable resistance element. Generally, in an information processing system, it is desirable to provide both a DRAM temporarily storing data used in processing and a non-volatile RAM storing program and table data. Then, if a configuration in which both the DRAM and the non-volatile RAM are implemented on a single chip is employed, large advantages for miniaturization of devices and for manufacturing cost can be obtained.

In order to achieve a semiconductor memory device in which the DRAM and the non-volatile RAM are implemented on a single chip, memory cell fabrication techniques common between manufacturing processes of the DRAM and the non-volatile RAM have been conventionally known. For example, Patent Reference 1 discloses a technique to form capacitors used in the DRAM and capacitors used in the non-volatile RAM on conductive oxide electrodes having the same structure. Patent Reference 2 discloses a technique to form capacitors used in the DRAM and capacitors used in the non-volatile RAM on lower electrodes and barrier layers respectively having the same structure.

Patent Reference 1: Japanese Patent Application Laid-open No. H7-94681

Patent Reference 2: Japanese Patent Application Laid-open No. H9-82914

However, even when employing either of the techniques disclosed in the above Patent References 1 and 2, at least both making processes for the DRAM and the non-volatile RAM need to be performed in series in implementing them on a single chip because of a difference in material of dielectric films. As a result, the manufacturing process becomes complex, which causes problems including a decrease in yield and an increase in cost. Also, there is a problem that regions of the DRAM and the non-volatile RAM cannot be arbitrarily set after the manufacturing process and thereby it is difficult to flexibly apply to various applications.

SUMMARY

The present invention seeks to solve one or more of the above problems and provides a semiconductor memory device in which a DRAM memory cell array and a non-volatile RAM memory cell array are both implemented and a selectively designated area thereof can be freely changed by performing the forming for the area.

An aspect of the present invention is a semiconductor memory device comprising: a memory cell array including a plurality of first memory cells each having a structure in which dielectric material is sandwiched between two electrodes, the memory cell array being divided into a plurality of areas capable of being designated; and a forming controller controlling to perform forming for the first memory cells so as to be changed to non-volatile second memory cells in an area selectively designated from the plurality of areas of the memory cell array.

According to the semiconductor memory device of the aspect, the memory cell array including the plurality of first memory cells is formed in a first step. Then, the forming is performed for the first memory cells included in the area designated from the memory cell array, and thereby the first memory cells are changed to the non-volatile second memory cells. Accordingly, the first memory cells and the second memory cells can be arranged in a predetermined ratio as necessary for each area, and a semiconductor memory device in which the DRAM and the non-volatile RAM are implemented on a single chip, for example, can be provided in a low cost.

It is advantageous to implement the semiconductor memory device of the aspect particularly in an information processing system having a processor. In this case, after the implementation of the semiconductor memory device, a memory configuration thereof can be freely changed by the forming.

As described above, according to the invention, by performing the forming for a desired area in the memory cell array of the semiconductor memory device, the DRAM memory cell array can be freely changed to the non-volatile memory cell array. Therefore, there is an effect that a semiconductor chip having both the DRAM and the RRAM, for example, can be manufactured in a low cost. Further, since areas for the DRAM memory cell array and the non-volatile memory cell array can be arbitrary set after the manufacturing process, there is an effect that the invention can be flexibly applied to a variety of applications. As a result, the number of components in various mobile information devices having the semiconductor memory device is suppressed, and thus a reduction in consumption current and excellent cost performance can be realized.

BRIEF DESCRIPTION OF THE DRAWINGS

The above featured and advantages of the present invention will be more apparent from the following description of certain preferred embodiments taken in conjunction with the accompanying drawings, in which:

FIG. 1 is a block diagram showing an entire configuration of a semiconductor memory device of an embodiment;

DETAILED DESCRIPTION OF THE PREFERRED EMBODIMENTS

Figure 2A:
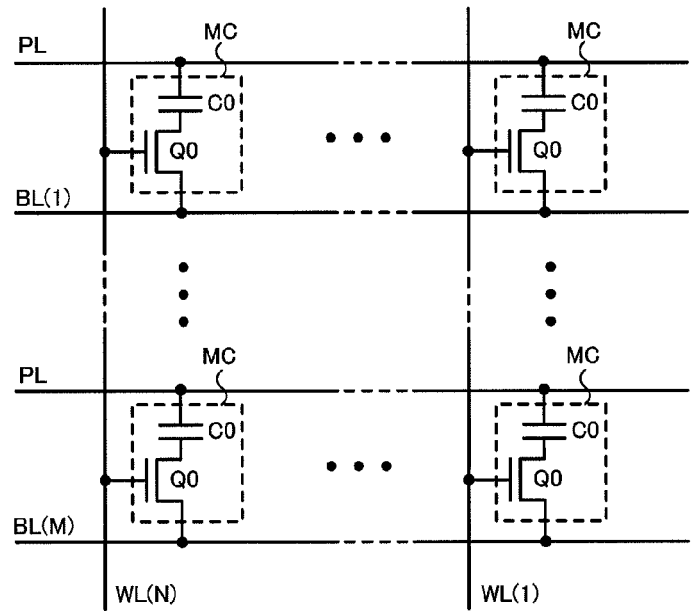
FIGS. 2A and 2B are a diagram in which equivalent circuits of a DRAM memory cell array in a state before performing the forming and a RRAM memory cell array in a state after performing the forming are compared in the semiconductor memory device of the embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes. In the following, an embodiment will be described with reference to the drawings, in which the present invention is applied to a semiconductor memory device capable of changing an area for a DRAM memory cell array to an area for a RRAM memory cell array.

FIG. 1 is a block diagram showing an entire configuration of the semiconductor memory device of this embodiment. As shown in FIG. 1, the semiconductor memory device of the embodiment includes four memory cell arrays 10, and includes rows of global sense amplifiers 11, rows of global sense amplifiers 11, column decoders 12 and row decoders 13, which are attached to the memory cell arrays 10 one by one. Further, there are provided a control circuit 14 controlling an operation of the entire semiconductor memory device, an array information memory 15 storing information about changes in the memory cell arrays 10, and an input/output port 16 for inputting/outputting data from/to outside.

In the above configuration, each memory cell array 10 includes a large number of memory cells formed at intersections of a plurality of word lines and a plurality of bit lines. Each row of global sense amplifiers 11 includes a plurality of global sense amplifiers each of which selectively amplifies a signal read out from a selected memory cell to the bit line and transmitted to the global bit line via the sense amplifier (not shown in FIG. 1). Each column decoder 12 decodes a designated column address and selects a global bit line through which a read or write signal is transmitted. Each row decoder 13 decodes a designated row address and selects a word line connected to the selected memory cell.

Meanwhile, external commands, addresses and data are inputted/outputted to/from the control circuit 14 through the input/output port 16. The control circuit 14 sends a column address to the column decoder 12 and sends a row address to the row decoder 13 respectively of the received addresses. Under the control of the control circuit 14, the read or write data of the memory cell array 10 is inputted or outputted through the row of global sense amplifiers 11, the control circuit 14 and the input/output port 16. In addition, the control circuit 14 includes a forming controller controlling to perform "forming" described later.

Address information of areas to be changed in the memory cell array 10 by the forming is stored in the array information memory 15. When manufacturing the semiconductor memory device of the embodiment, the four memory cell arrays 10 are fabricated first as DRAM memory cell arrays. Then, in order to change some of memory cell arrays 10 to RRAM memory cell arrays by performing the forming for them, the address information of the area to be changed is inputted through the input/output port 16 and is programmed in the array information memory 15. In the array information memory 15, when a forming performing command is received through the input/output port 16, a designation signal of the memory cell array 10 as a forming target is sent to the forming controller of the control circuit 14. The control circuit 14 controls so that all word lines are selected by the row decoder 13 attached to the designated memory cell array 10 based on the designation signal of the array information memory 15, and the forming for the memory cell array 10 to be changed is performed in a later-mentioned procedure.

Figure 2B:
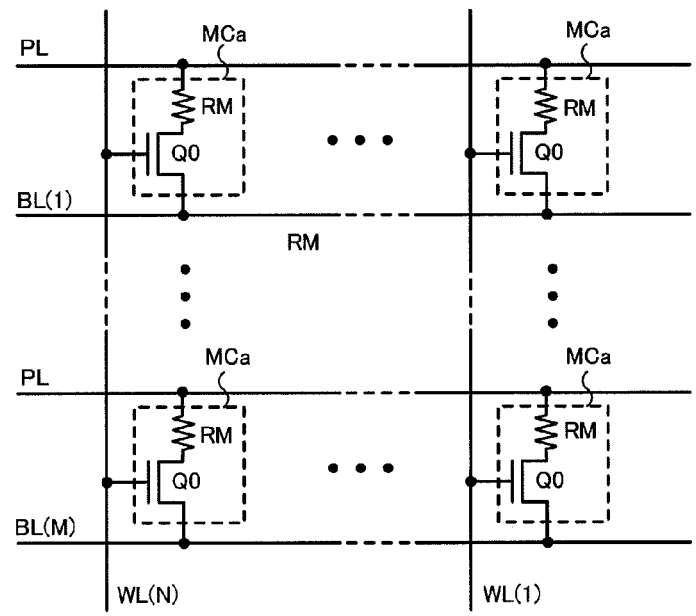

FIGS. 2A and 2B are diagrams in which respective equivalent circuits of the DRAM memory cell array in a state before performing the forming for the memory cell array 10 and the RRAM memory cell array in a state after performing the forming for the memory cell array 10 are compared in the semiconductor memory device of the embodiment. As shown in FIG. 2A, each memory cell MC (the first memory cell of the invention) of the DRAM memory cell array is arranged at each intersection of word lines WL and bit lines BL, and is composed of a selection NMOS transistor Q0 and a capacitor C0. Here, circuit configuration and operation of the memory cell MC will be described later (see FIG. 3). As shown in FIG. 2A, since N word lines WL(1) to WL(N) and M bit lines BL (1) to BL(M) are arranged in the DRAM memory cell array, M×N memory cells MC are provided in total. The capacitor C0 of each memory cell MC is connected to a common plate line PL at one end, and the forming can be performed by controlling the voltage of the common plate line PL, as described later.

As shown in FIG. 2B, each memory cell MCa (the second memory cell of the invention) of the RRAM memory cell array in a state after performing the forming is arranged in the same manner as in FIG. 2A, and is composed of a selection NMOS transistor Q0 and a resistance element RM. Here, circuit configuration and operation of the memory cell MCa will be described later. In FIG. 2B, the N word lines WL(1) to WL(N), the M bit lines BL (1) to BL(M), and the common plate line PL are the same as in FIG. 2A.

Preferred materials for forming the capacitor C0 of FIG. 2A are dielectric materials containing transition metal oxides, such as titanium oxide, nickel oxide, yttrium oxide, zirconium oxide, niobium oxide, lanthanum oxide, hafnium oxide, tatalum oxide, tungsten oxide, or mixed materials thereof, or containing aluminum oxide, silicon oxide, or mixed materials thereof. Then, the capacitor C0 is formed by a structure in which such dielectric material is sandwiched between two electrodes.

The resistance element RM of FIG. 2B is formed by performing the later-mentioned forming for a predetermined number of memory cell arrays 10 among the plurality of memory cell arrays 10. That is, the resistance element RM is formed by forming a conductive path in the dielectric material of the capacitor C0 having the above structure using filament or the like. This conductive path is known to maintain a low resistance state and a high resistance state in a non-volatile manner, and thus is used as an information storage element of a resistive non-volatile RAM (generally referred to as RRAM).

Data can be written into the RRAM memory cell array of the embodiment by changing the polarity of a voltage applied between two terminals of the resistance element RM of the memory cell MCa so as to shift between low and high resistance states. Accordingly, a voltage VDD/2 equal to half a power supply voltage VDD is supplied to the common plate line PL, and thereby the writing is performed in a state where the bit line BL is set to the power supply voltage VDD or a ground potential VSS in response to the low or high resistance state. The operation in this case is the same as the write operation of the DRAM memory cell array. Further, a read operation for the RRAM memory cell array can be performed by sensing and amplifying a current flowing through the resistance element RM in a state where a predetermined voltage is applied to the resistance element RM, as described later.

Figure 3:
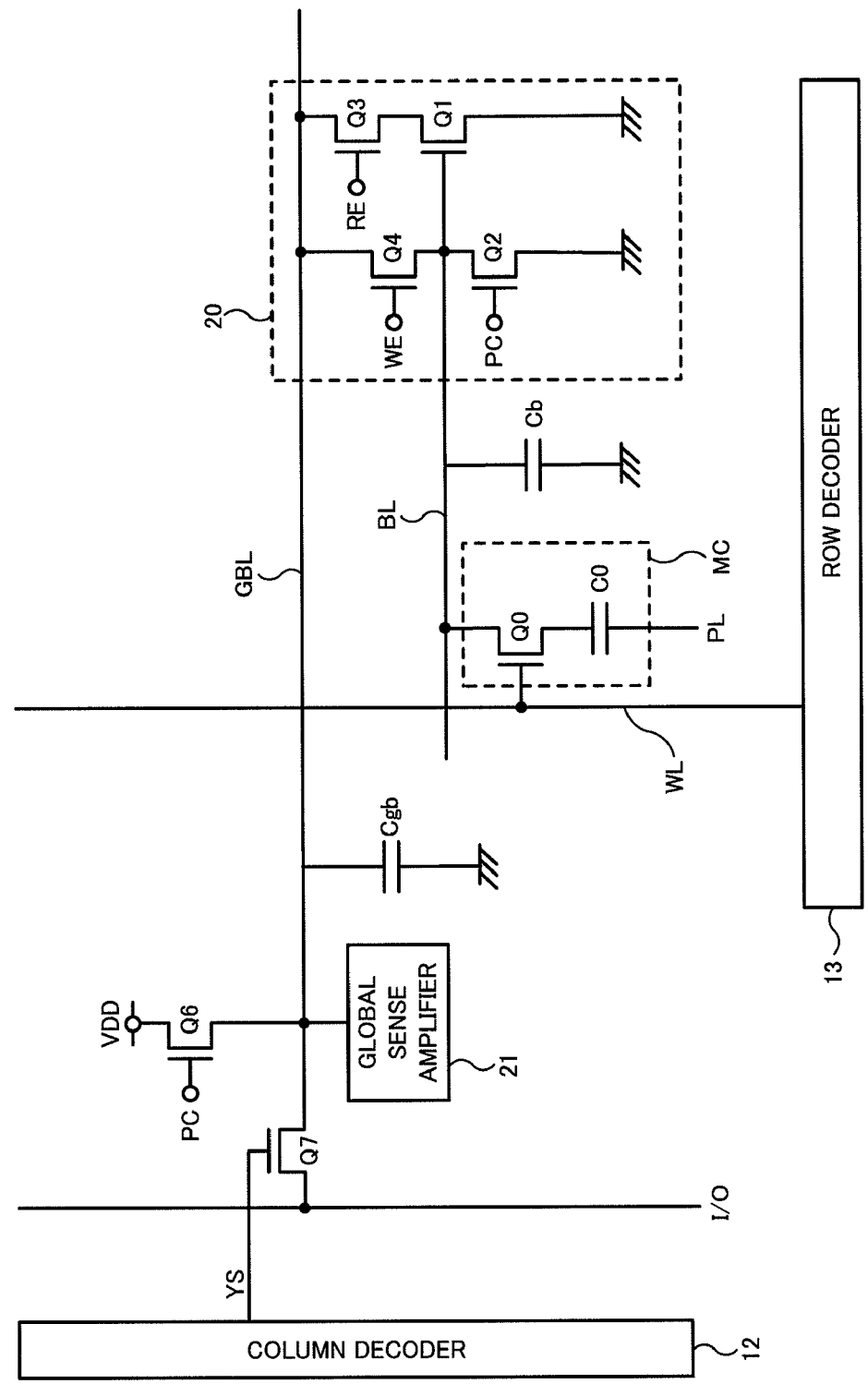
FIG. 3 is a diagram showing a specific circuit configuration of a memory cell and a sense amplifier circuit when configuring the DRAM memory cell array in the semiconductor memory device of the embodiment.

FIG. 3 is a diagram showing a specific circuit configuration of a memory cell and a sense amplifier circuit when configuring the DRAM memory cell array in the semiconductor memory device of the embodiment. FIG. 3 shows one word line WL and one bit line BL, one memory cell MC arranged at an intersection thereof, one sense amplifier 20, one global bit line GBL, one global sense amplifier 21, NMOS transistor Q6 and Q7 provided at one end of the global bit line GBL, the column decoder 12 and the row decoder 13.

In FIG. 3, the memory cell MC of the DRAM memory cell array is composed of a selection NMOS transistor Q0 and a capacitor C0 storing information in accordance with accumulated charge. The selection NMOS transistor Q0 has a gate connected to the word line WL, a source connected to the bit line BL, and a drain connected to one terminal of the capacitor C0. The other terminal of the capacitor C0 is connected to the common plate line PL. The common plate line PL is supplied with a voltage of, for example, VDD/2 (half the power supply voltage VDD). In addition, when performing the forming, a forming voltage VFC is supplied to the common plate line PL. Although FIG. 3 shows only one memory cell MC, a plurality of memory cells MC are actually connected to each bitline BL. Thereby, a parasitic capacitance Cb is formed at each bit line BL, as shown in FIG. 3.

The sense amplifier 20 includes four NMOS transistors Q1, Q2, Q3 and Q4. The NMOS transistor Q1 has a gate connected to the bit line BL, and senses and amplifies the signal voltage of the bit line BL so as to convert it into a drain current. A precharge signal PC is applied to the gate of the NMOS transistor Q2, and when the precharge signal PC is high, the NMOS transistor Q2 precharges the bit line BL to the ground potential. The NMOS transistor Q3 switches connection between the drain of the NMOS transistor Q1 and the global bit line GBL in response to a control signal RE inputted to the gate of the NMOS transistor Q3. The NMOS transistor Q4 switches connection between the bit line BL and the global bit line GBL in response to a control signal WE inputted to the gate of the NMOS transistor Q4.

In FIG. 3, the parasitic capacitance Cb has a capacitance of about 5 fF, for example. Further, the capacitor C0 of the memory cell MC has a capacitance of about 10 fF, for example. Therefore, in a read operation of the memory cell MC, the signal voltage is read out to the bit line BL by a charge sharing of a transmission path including the capacitance of the capacitor Cs of the memory cell MC and the parasitic capacitance Cb at the bit line BL. Accordingly, in the read operation, the selection NMOS transistor Q0 of the memory cell MC is turned on so that the charge sharing is started, and a sufficient difference corresponding to existence of the accumulated charge on the capacitor C0 can be obtained at the potential of the bit line BL after several ns. Therefore, by setting a sense term for the sense amplifier 20 within a range until the elapse of this several ns, sufficient margin to complete the sense amplifying operation by the NMOS transistor Q1 can be obtained. Due to such an operating principle, the number of memory cells MC connected to the bit line BL is desired to be set within a range where the signal voltage required for the charge sharing can be obtained.

The global sense amplifier 21 is connected to one end of each global bit line GBL. The global sense amplifier 21 latches the signal transmitted through the global bit line GBL via the sense amplifier 20 and determines a binary value of the signal level. The NMOS transistor Q6 has a gate to which the precharge signal PC is applied, and precharges the global bit line GBL to the power supply voltage VDD when the precharge signal PC is high. A bit line BL selected from a predetermined number of bit lines BL is actually connected to the global bit line GBL via the sense amplifier 20, which is not shown in FIG. 3, In addition, a parasitic capacitance Cgb is formed at each global bit line GBL, as shown in FIG. 3.

The NMOS transistor Q7 switches connection between the global bit line GBL and I/O lines in response to a column selection signal YS inputted to the gate. In the read operation, read data from the global sense amplifier 21 is transmitted to the I/O lines via the NMOS transistor Q7 and is outputted to an external circuit (not shown). In the write operation, write data received from the external circuit is transmitted through the I/O lines and is inputted to the global sense amplifier 21 via the NMOS transistor Q7. Thereby, the global bit line GBL is driven, and data is written into a desired memory cell MC passing through the sense amplifier 20 and the bit line BL.

Figure 4:
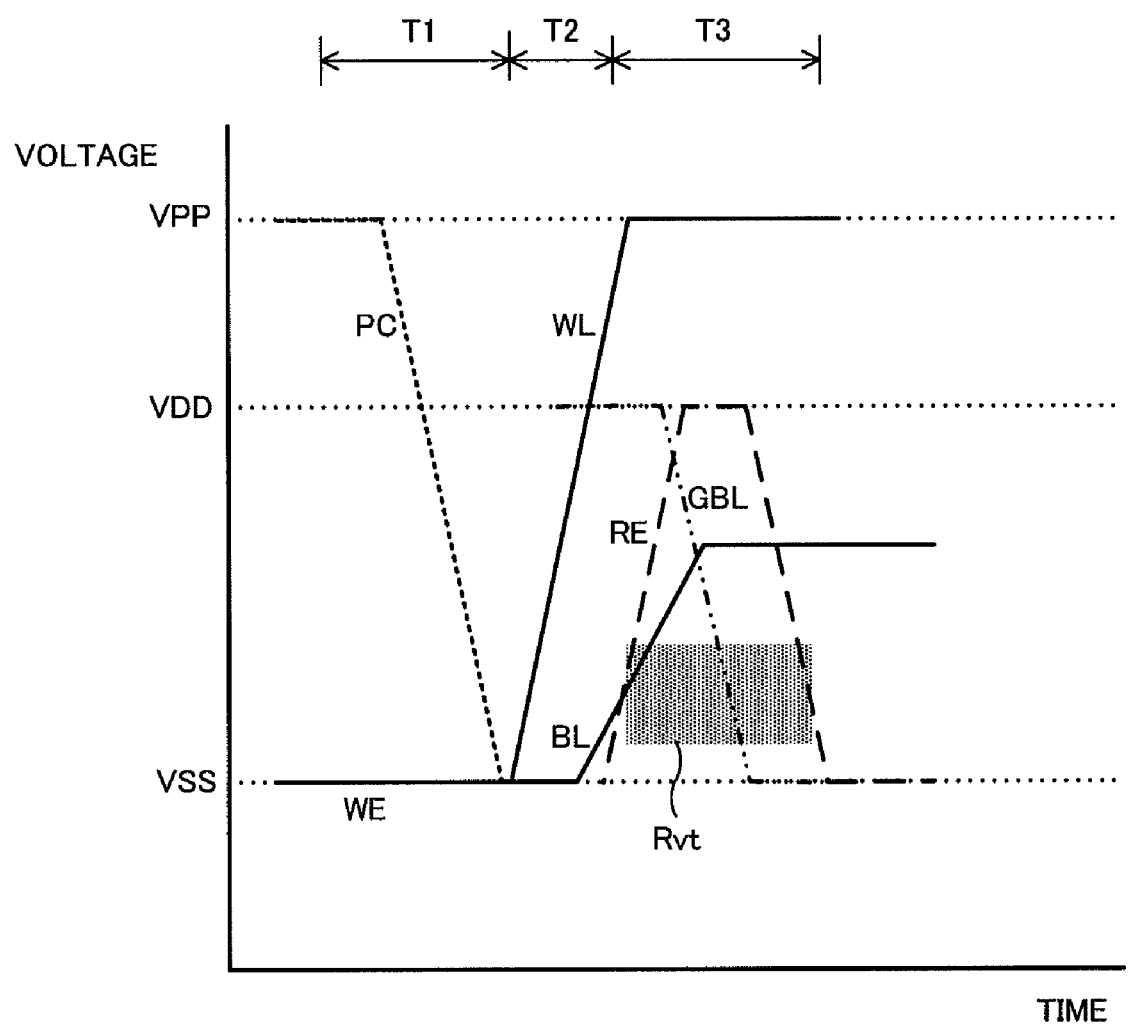
FIG. 4 is a diagram showing signal waveforms in case of reading high level data from the memory cell in a read operation for the DRAM memory cell array of the embodiment.
Figure 5:
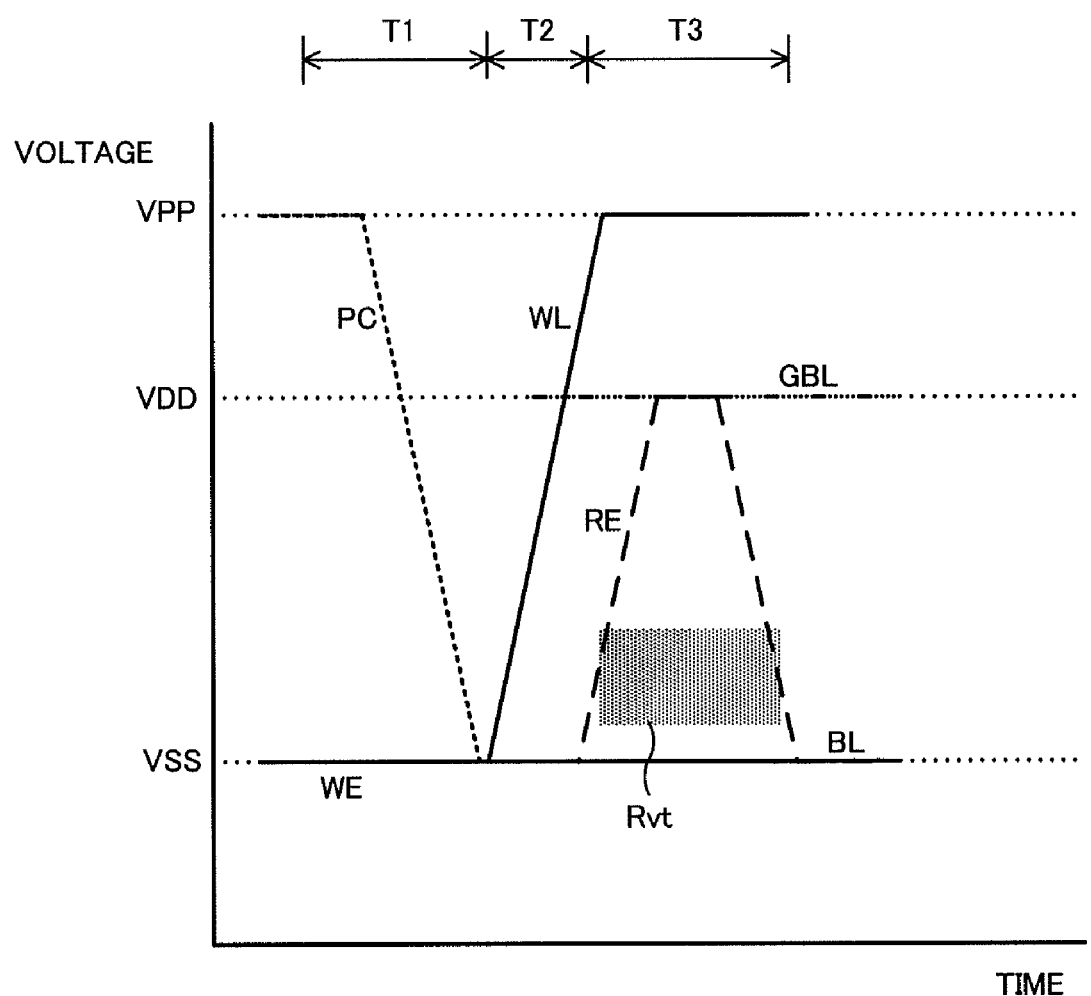
FIG. 5 is a diagram showing signal waveforms in case of reading low level data from the memory cell in the read operation for the DRAM memory cell array of the embodiment.

Next, the read operation for the DRAM memory cell array of the embodiment will be described using FIGS. 4 and 5. FIG. 4 shows signal waveforms for sensing in case of reading high level data stored in the memory cell MC, and FIG. 5 shows signal waveforms for sensing in case of reading low level data stored in the memory cell MC. In upper parts of FIGS. 4 and 5, the entire read operation is divided into three terms including a precharge cancel term T1, a cell selection term T2 and a sense term T3.

In the read operation of the high level data as shown in FIG. 4, the precharge signal PC is maintained high before the precharge cancel term T1, as shown in FIG. 4, in order to precharge the bit line BL and the global bit line GBL. Then, in the precharge cancel term T1, the precharge signal PC is controlled to be low, the bit line BL which is precharged to the ground potential VSS is brought into a state of floating, and the global bit line GBL which is precharged to the power supply voltage VDD is brought into a state of floating. Subsequently, in the cell selection term T2, the potential of the selected word line WL is increased to a positive voltage VPP, and the signal voltage of high level is read out from the memory cell MC to the bit line BL.

Subsequently, in the sense term T3, the control signal RE is controlled to be high in a predetermined time range. At this point since the potential of the bit line BL is higher than an upper limit of a distribution range Rvt (indicated by hatching in the figure) of a threshold voltage of the NMOS transistor Q1, a large drain current flows through the NMOS transistor Q1. Therefore, the electric charge charged on the parasitic capacitance Cgb at the global bit line GBL is extracted through the NMOS transistors Q3 and Q1 in a short time, and thereby the potential of the global bit line GBL is discharged from the power supply voltage VDD to the ground potential VSS in a short time. The signal voltage of the global bit line GBL is inverted and latched by the global sense amplifier 21.

In addition, the variation permissible range Rvt of the threshold voltage of the NMOS transistor Q1 as shown in FIG. 4 indicates a range where the threshold voltage varies due to a variation in dimension, a variation in thickness of a gate insulating film, a fluctuation in channel impurity distribution, or the like, when fabricating the NMOS transistor Q1.

Next, in the read operation of the low level data as shown in FIG. 5, signal waveforms in the precharge cancel term T1 are the same as in FIG. 4. Subsequently, in the cell selection term T2, the potential of the selected word line WL is increased to the positive voltage VPP, and the signal voltage of low level is read out from the memory cell MC to the bit line BL. Subsequently, in the sense term T3, the control signal RE is controlled to be high in a predetermined time range. Then since the potential of the bit line BL is lower than a lower limit of the distribution range Rvt of the threshold voltage of the NMOS transistor Q1, a drain current does not flow through the NMOS transistor Q1. Therefore, the electric charge charged on the parasitic capacitance Cgb at the global bit line GBL is not extracted, and thus the potential of the global bit line GBL is maintained at the power supply voltage VDD. The signal voltage of the global bit line GBL is inverted and latched by the global sense amplifier 21.

Figure 6:
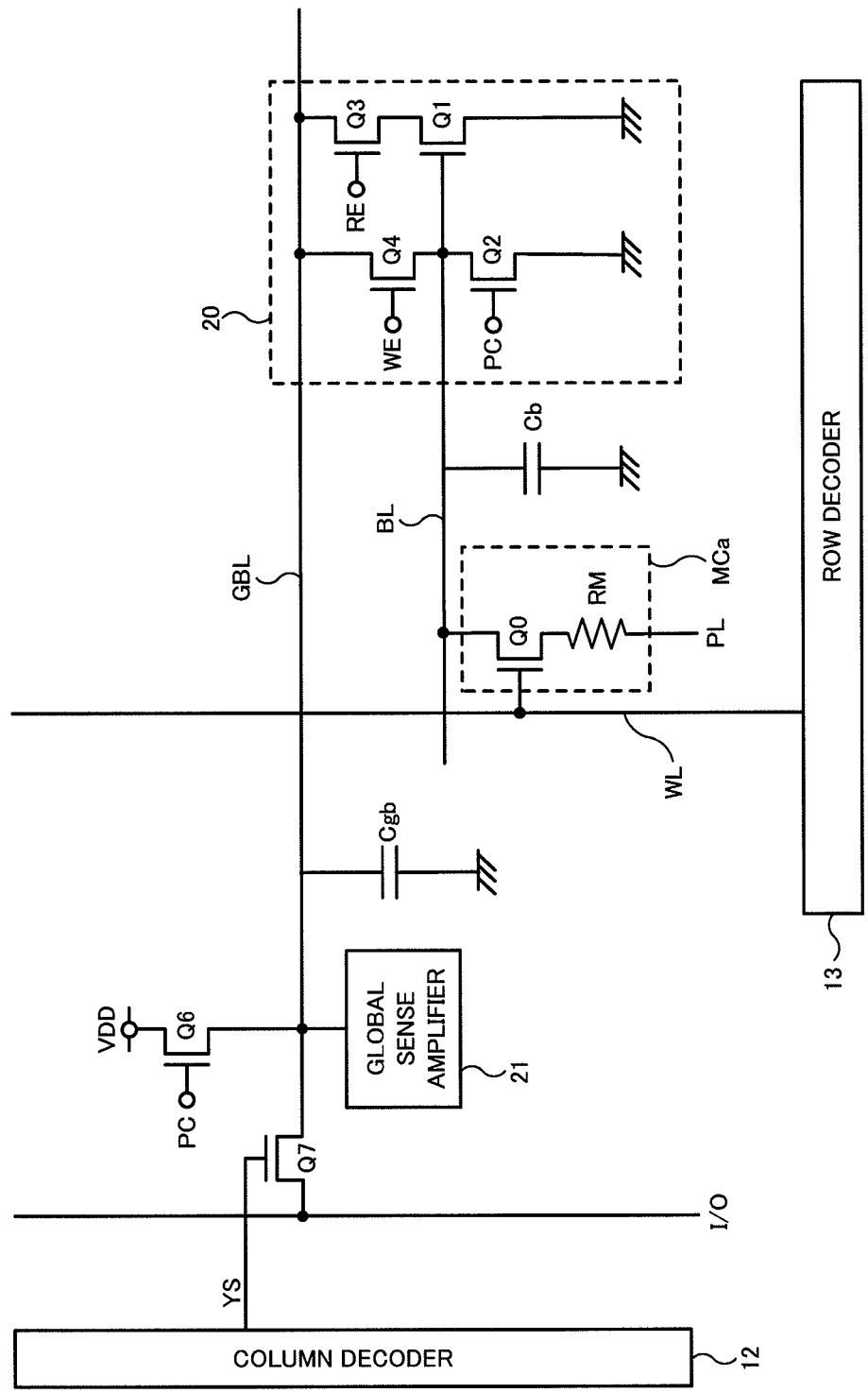
FIG. 6 is a diagram showing a specific circuit configuration of a memory cell and a sense amplifier circuit when configuring the RRAM memory cell array in the semiconductor memory device of the embodiment.

Next, FIG. 6 is a diagram showing a specific circuit configuration of a memory cell and a sense amplifier circuit when configuring the RRAM memory cell array in the semiconductor memory device of the embodiment. In FIG. 6, many parts of the circuit configuration are common to those in FIG. 3, and thus different points will be described. As shown in FIG. 6, the memory cell MCa of the RRAM memory cell array is composed of the selection NMOS transistor Q0 and a resistance element RM storing information in accordance with a resistance value. The selection NMOS transistor Q0 has a gate connected to the word line WL, a drain connected to the bit line BL, and a source connected to one terminal of the resistance element RM. The other terminal of the resistance element RM is connected to the common plate line PL. The common plate line PL is supplied with a voltage of, for example, VDD/2 (half the power supply voltage VDD), as described above.

As to the resistance element RM, an upper limit of a resistance value distribution of the low resistance state is, for example, 100 kΩ, and a lower limit of a resistance value distribution of the high resistance state is, for example, 10MΩ. If the parasitic capacitance Cb at the bit line BL is, for example, about 5 fF as mentioned above, a time constant of a transmission path including the resistance element RM and the parasitic capacitance Cb at the bit line BL is under 0.5 ns when the resistance element RM is in the low resistance state, and is over 50 ns when the resistance element RM is in the high resistance state. Accordingly, in the read operation, by turning on the selection NMOS transistor Q0 to start the charging operation of the bit line BL, a sufficient difference corresponding to the resistance value of the resistance element RM can be obtained at the potential of the bit line BL after several ns. Therefore, by setting the sense term T3 for the sense amplifier 20 within a range until the elapse of this several ns, sufficient margin to complete the sense amplifying operation by the NMOS transistor Q1 can be obtained. Due to such an operating principle, the number of memory cells MC connected to the bit line BL can be variously set within a range of the parasitic capacitance Cb which conforms to design values of the resistance value of the resistance element RM and the sense term T3.

Figure 7:
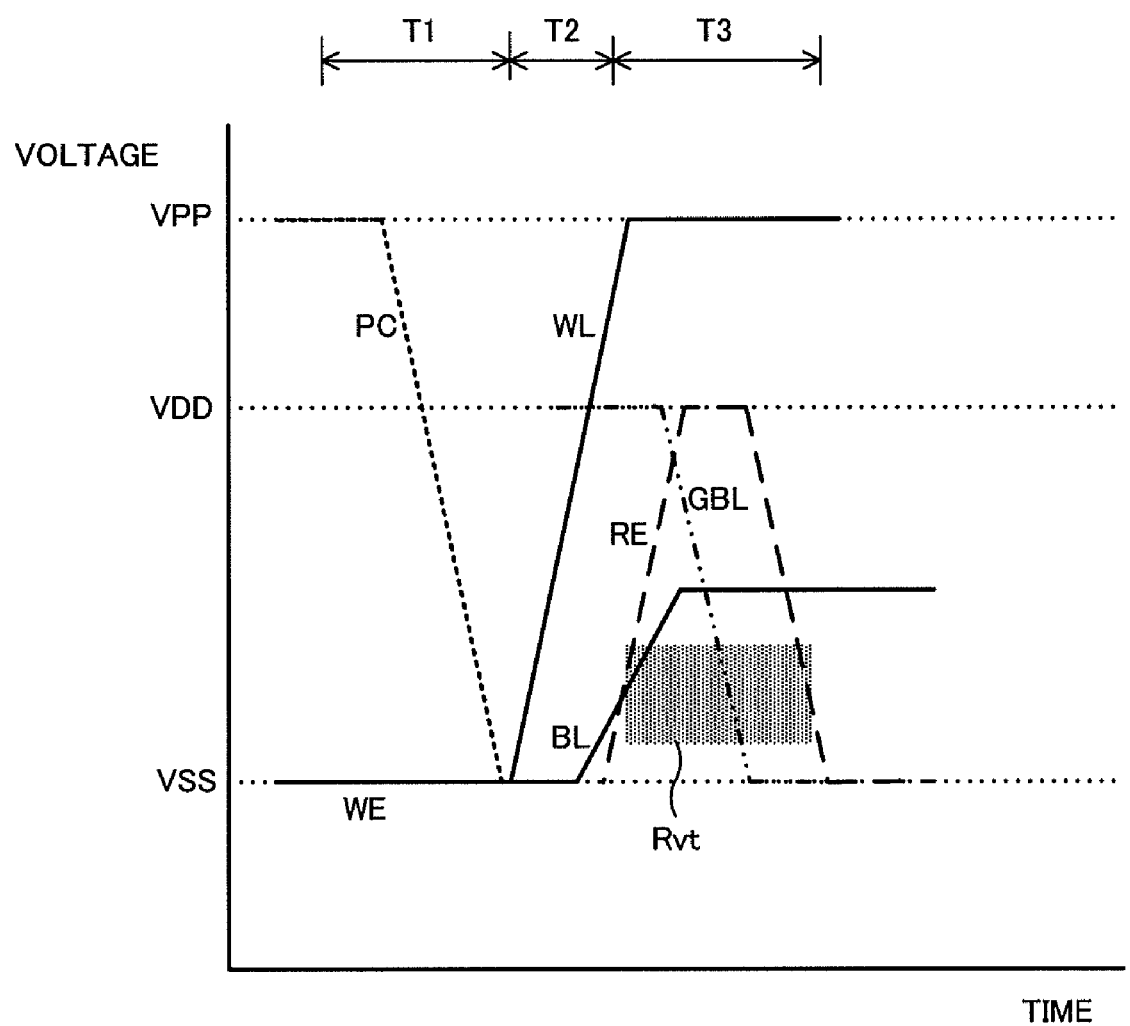
FIG. 7 is a diagram showing signal waveforms in case of reading high level data (low resistance state) from the memory cell in a read operation for the RRAM memory cell array of the embodiment.
Figure 8:
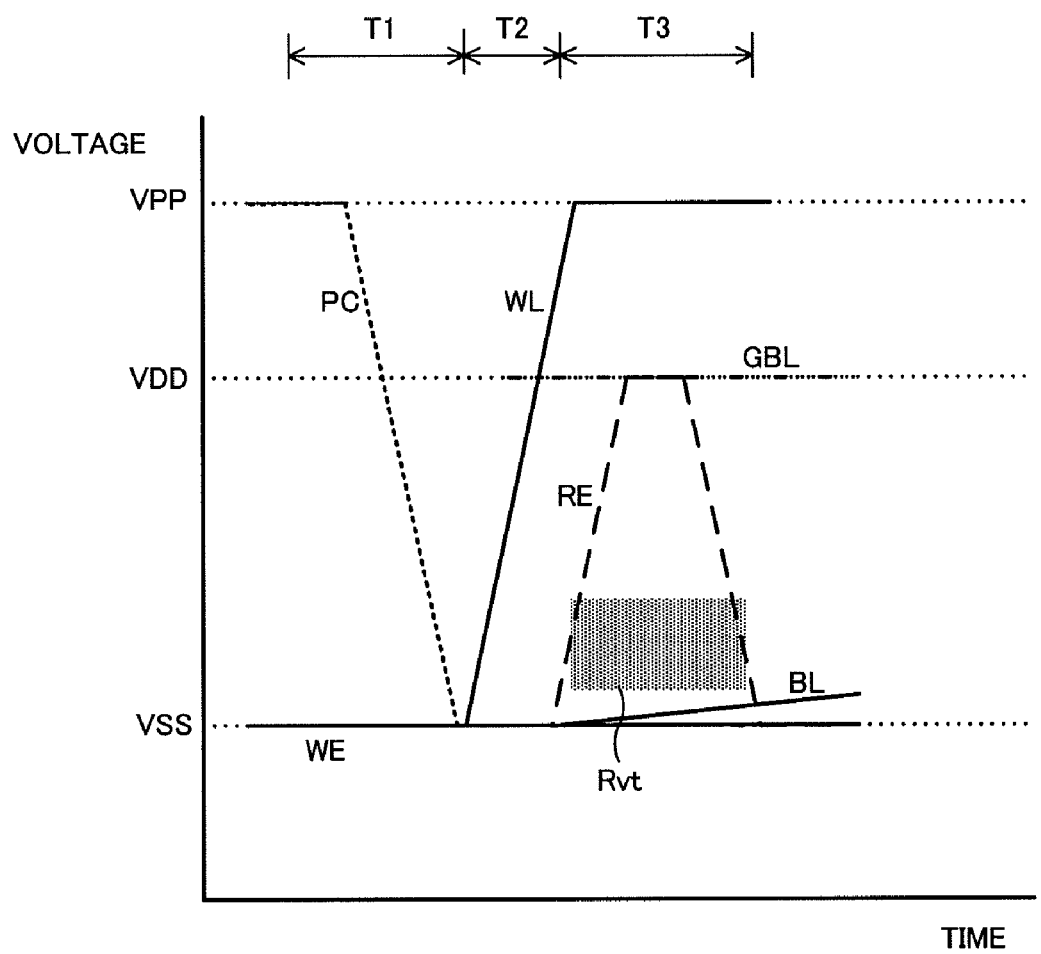
FIG. 8 is a diagram showing signal waveforms in case of reading low level data (high resistance state) from the memory cell in a read operation for the RRAM memory cell array of the embodiment.

Next, the read operation for the RRAM memory cell array of the embodiment will be described using FIGS. 7 and 8. FIG. 7 shows signal waveforms for sensing in case of reading high level data (low resistance state) stored in the memory cell MCa, and FIG. 8 shows signal waveforms for sensing in case of reading low level data (high resistance state) stored in the memory cell MCa. FIGS. 7 and 8 correspond to FIGS. 4 and 5, in which many waveforms are common to each other, and thus different points will be mainly described below.

In the read operation of the low resistance state in FIG. 7, signal waveforms before the precharge cancel term T1 are the same as in FIG. 4. Subsequently, in the selection term T2, the potential of the selected word line WL is increased to the positive value VPP, and the signal voltage of the memory cell MCa is read out to the bit line BL with the time constant corresponding to the low resistance state of the resistance element RM. Then, in the sense term T3, the potential of the bit line BL is higher than the upper limit of he distribution range Rvt of the threshold voltage of the NMOS transistor Q1, a large drain current flows through the NMOS transistor Q1. Subsequent operations are performed in the same manner as in FIG. 4.

Next, in the read operation of the high resistance state in FIG. 8, signal waveforms before the precharge cancel term T1 are the same as in FIG. 7. Subsequently, in the cell selection term T2, the potential of the selected word line WL is increased to the positive voltage VPP, and the signal voltage of the memory cell MCa is read out to the bit line BL with the time constant corresponding to the high resistance state of the resistance element RM. Then, in the sense term T3, the potential of the bit line BL in FIG. 8 slightly increases in comparison with FIG. 5. However, this potential is maintained lower than the lower limit of the distribution range Rvt of the threshold voltage of the NMOS transistor Q1, and thus the drain current flowing through the NMOS transistor Q1 is extremely small. Therefore, the electric charge charged in the parasitic capacitance Cgb at the global bit line GBL is hardly extracted. Subsequent operations are performed in the same manner as in FIG. 5.

Figure 9:
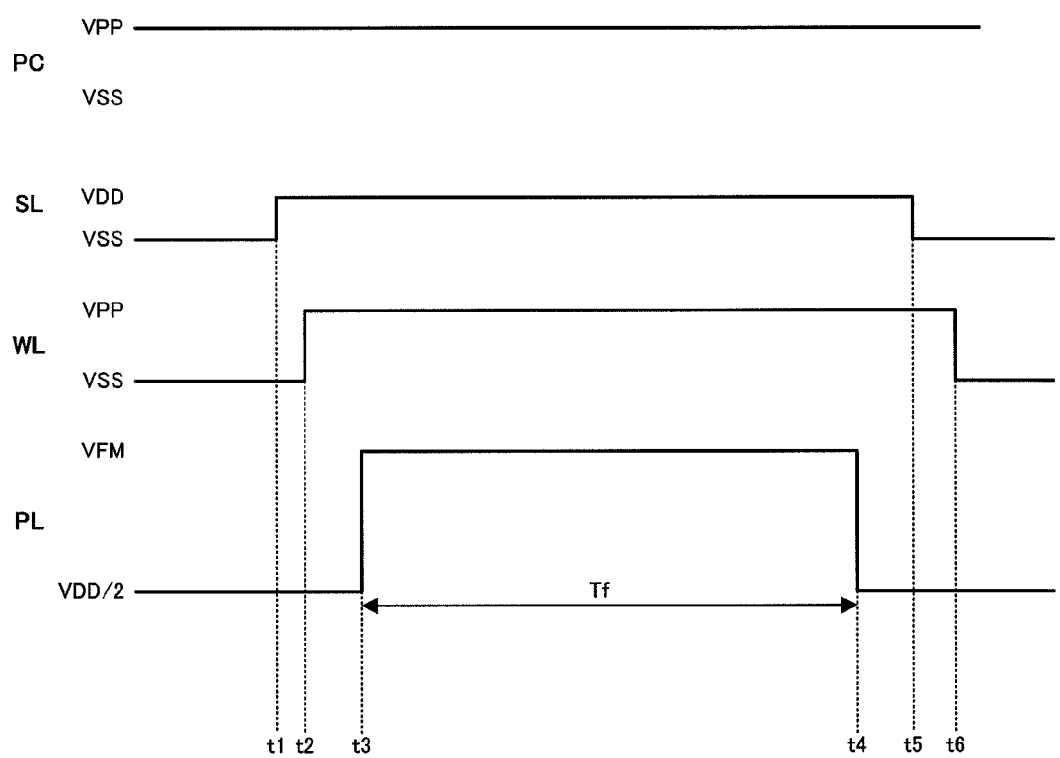
FIG. 9 is a diagram showing operation waveforms and a timing flow in a forming process which is applied to change the DRAM memory cell array to the RRAM memory cell array.
Figure 10:
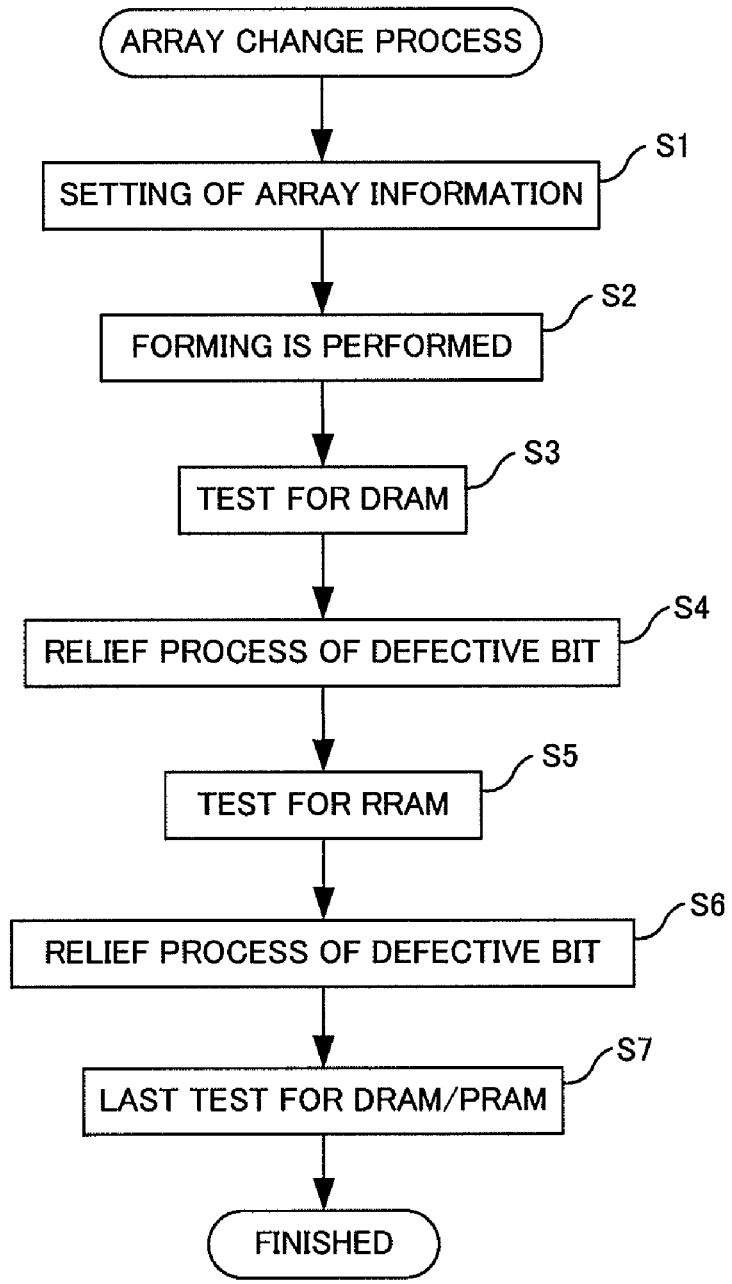
FIG. 10 is a diagram showing a flow chart explaining a changing process attached to the forming process for changing the DRAM memory cell array to the RRAM memory cell array.

Next, a control procedure for changing the DRAM memory cell array to the RRAM memory cell array in the semiconductor memory device of the embodiment will be described with reference to FIGS. 9 and 10. FIG. 9 shows operation waveforms and a timing flow in a forming process which is applied to change the DRAM memory cell array to the RRAM memory cell array. FIG. 10 shows a flow chart explaining a changing process attached to the forming process for changing the DRAM memory cell array to the RRAM memory cell array.

In FIG. 9, the forming process of the semiconductor memory device is started in a state where the memory cell array 10 is previously precharged. First, an all word line selection signal SL supplied from the control circuit 14 to the memory cell array 10 is controlled to be high (power supply voltage VDD) at a timing t1. Thereby, the row decoder 13 becomes in a state where all word line WL are selected. Subsequently, N word lines WL in the memory cell array 10 are driven at a timing t2, and the potential thereof increases to the positive voltage VPP. Next, the potential of the common plate line PL is set to a forming voltage VFM at a timing t3. By maintaining this state during a predetermined forming term Tf, the forming for the memory cells MC is performed. The potential of the common plate line PL is returned from the forming voltage VFM to VDD/2 at a timing t4 at which the forming term Tf is finished. Then, the all word line selection signal SL is returned to low (ground potential VSS) at a timing t5. Thereby, all the word lines WL are returned to the ground potential VSS corresponding to a non-selected state at a timing t6, and the forming process of FIG. 9 is completed.

In FIG. 10, the changing process from the DRAM memory cell array to the RRAM memory cell array is performed together with the forming process of FIG. 9. First, the address information of the memory cell array 10 to be changed to the RRAM memory cell array is set in the array information memory 15 (Step S1). Specifically, the address information received through the input/output port 16 is programmed using electrical fuses or the like provided in the array information memory 15. The above-mentioned forming process is performed for the memory cell array 10 to be changed to the RRAM memory cell array (Step S2). Specifically, when receiving the forming command through the input/output port 16, the forming process is performed in accordance with the timing flow of FIG. 9.

On the other hand, each of memory cell arrays 10 for which the forming process is not performed is used as the DRAM memory cell array, and therefore DRAM test is performed for this memory cell arrays 10 (Step S3). As a result, when a defective bit exists in the memory cell array 10, a relief process for a corresponding address is performed (Step S4). Subsequently, since the memory cell array 10 for which the above forming process has been performed is used as the RRAM memory cell array, RRAM test is performed for this memory cell arrays 10 (Step S5). As a result, when a defective bit exists in the memory cell array 10, a relief process for a corresponding address is performed (Step S6). An example of specific relief processes in Steps S4 and S6 may be that defective address information received through the input/output port 16 is programmed using the electrical fuses or the like. Finally, final tests for relief check of the respective DRAM memory cell array and the RRAM memory cell array are performed (Step S7), and the changing process of FIG. 10 is completed.

When manufacturing the semiconductor memory device, the changing process as described above can be performed in a probe test process performed at a point that a wafer process is completed, or in a screening process after package sealing. Further, after the semiconductor memory device is implemented in a system, the changing process maybe performed in the same manner using such as a processor or a special controller in the system.

Figure 11:
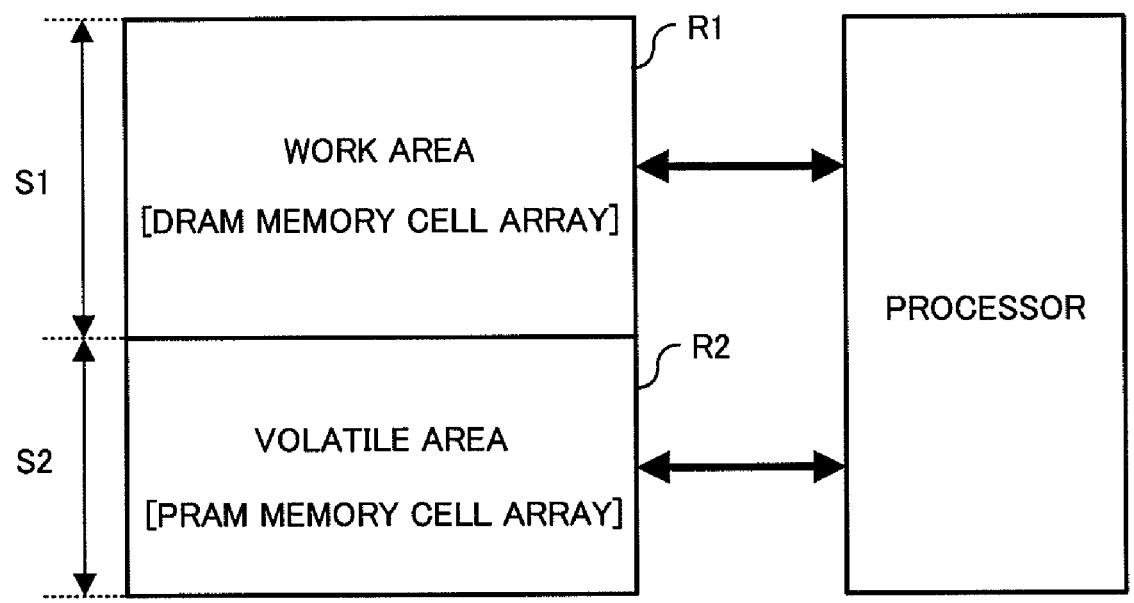
FIG. 11 is a diagram for explaining a configuration of a memory space and a transfer method between the semiconductor memory device and a processor in the embodiment.

Next, a configuration of a memory space and a transfer method between the semiconductor memory device and the processor in this embodiment will be described using FIG. 11. The memory space of the semiconductor memory device of the embodiment is schematically shown in the left side of FIG. 11. Further, the processor transferring data from/to the semiconductor memory device is shown in the right side of FIG. 11. The memory space of the semiconductor memory device includes a work area R1 composed of the DRAM memory cell array and a non-volatile area R2 composed of the RRAM memory cell array. Program codes and table data required for processing in the processor are stored in the non-volatile area R2. The processor stores temporary data in the work area R1 and executes the program read out from the non-volatile area R2. Further, the processor reads or rewrites the table data in the non-volatile area R2 as necessary.

Generally, the number of rewritings in the DRAM is not limited but the number of rewritings in the RRAM is limited. However, the programs and the table data stored in the above non-volatile area R2 need not to be rewritten frequently, and therefore using the RRAM memory cell array is not a problem. Meanwhile, since data stored in the non-volatile area R2 is maintained after the power supply for the semiconductor memory device is shut down, it is not required to implement a separate non-volatile memory in the system. Further, in the semiconductor memory device of the embodiment, it is possible to set a size S1 of the work area R1 and a size S2 of the non-volatile area R2 in a desired ratio, as shown in FIG. 11, and also the sizes S1 and S2 can be freely selected in the forming process after completing the wafer process, thereby configuring a flexible system.

Figure 12:
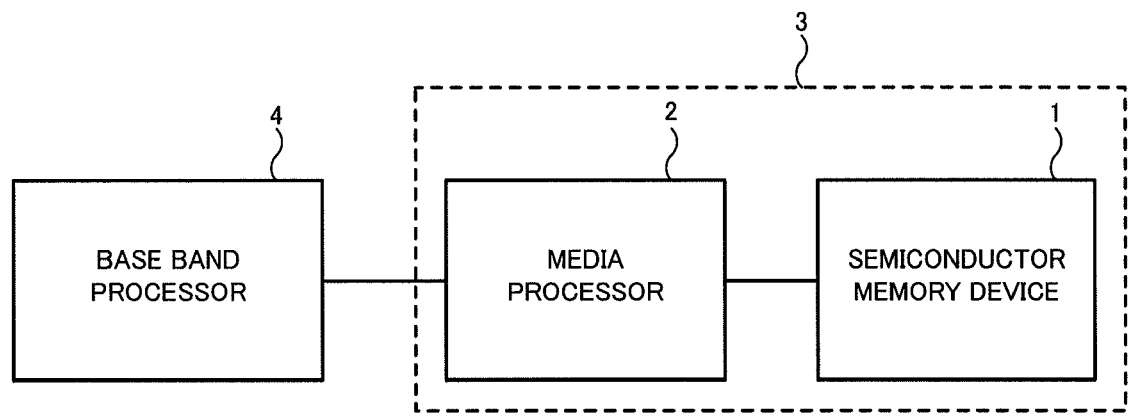
FIG. 12 is a diagram showing a system configuration of a mobile phone as an example of a system in which the semiconductor memory device of the embodiment is implemented.

FIG. 12 shows a system configuration of a mobile phone as an example in which the semiconductor memory device of the embodiment is implemented. The system configuration of FIG. 12 includes a system in package (SIP) 3 in which the semiconductor memory device 1 of this embodiment and a media processor 2 are stacked, and a base band processor 4 connected to the SIP 3. In the semiconductor memory device 1, for example, the memory space of FIG. 11 is configured to be provided with the work area R1 using the DRAM memory cell array and the non-volatile area R2 using the RRAM memory cell array for storing the program codes, the table data, various parameters and the like. In this manner, by employing the configuration of the semiconductor memory device of the embodiment, it is possible to achieve a simple configuration applied for various systems such as the mobile phone.

In the foregoing, contents of the embodiment have been specifically described based on the embodiment. However, the present invention is not limited to the above described embodiment, and can variously be modified without departing the essentials of the present invention. For example, the above embodiment has described the configuration divided into four memory cell arrays 10. However, the division of the memory cell arrays 10 is flexible, and the present invention can be widely applied to a configuration in which desired areas can be selectively designated.

The invention claimed is:

1. A semiconductor memory device comprising:
 a memory cell array including a plurality of first memory cells each having a structure in which dielectric material is sandwiched between two electrodes, the memory cell array being divided into a plurality of areas capable of being designated; and
 a forming controller controlling to perform forming for the first memory cells so as to be changed to non-volatile second memory cells in an area selectively designated from the plurality of areas of the memory cell array,
 wherein each of the first memory cells has a capacitor storing information corresponding to accumulated charge, and each of the second memory cells has a resistance element storing information corresponding to a resistance value.

2. The semiconductor memory device according to claim 1, wherein in the forming for the first memory cells, a conductive path is formed in the dielectric material by applying a predetermined voltage between the two electrodes.

3. The semiconductor memory device according to claim 1, wherein an area where the first memory cells are arranged serves as a DRAM memory cell array, and an area where the first memory cells are changed to the second memory cells by the forming serves as a non-volatile RRAM memory cell array.

4. The semiconductor memory device according to claim 3, further comprising a sense amplifier circuit amplifying a signal which is read out from each of the first or second memory cells and is transmitted through a bit line,
wherein the sense amplifier circuit is commonly used for both the DRAM memory cell array and the RRAM memory cell array.

5. The semiconductor memory device according to claim 1, wherein either a transition metal oxide, or aluminum oxide and silicon oxide or a mixed material thereof is used as the dielectric material.

6. The semiconductor memory device according to claim 5, wherein the transition metal oxide is one of titanium oxide, nickel oxide, yttrium oxide, zirconium oxide, niobium oxide, lanthanum oxide, hafnium oxide, tantalum oxide and tungsten oxide, or mixed materials thereof

7. An information processing system comprising:
the semiconductor memory device according to claim 1; and
a processor performing a process using data stored in the semiconductor device.

8. The information processing system according to claim 7, wherein the forming in the area selectively designated is performed after implementation of the semiconductor memory device in the system.

9. The semiconductor memory device according to claim 1, wherein an upper limit of a resistance value distribution of the resistance element in a low resistance state is 100 kΩ.

10. The semiconductor memory device according to claim 1, wherein a lower limit of a resistance value distribution of the resistance element in a high resistance state is 10 MΩ.

* * * * *